(12) United States Patent
Kim et al.

(10) Patent No.: US 11,646,260 B2
(45) Date of Patent: May 9, 2023

(54) SEMICONDUCTOR PACKAGE AND METHOD OF FABRICATING THE SAME

(71) Applicant: Samsung Electronics Co., Ltd., Suwon-si (KR)

(72) Inventors: Jongyoun Kim, Seoul (KR); Eungkyu Kim, Yongin-si (KR); Gwangjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/206,291

(22) Filed: Mar. 19, 2021

(65) Prior Publication Data

US 2022/0059444 A1 Feb. 24, 2022

(30) Foreign Application Priority Data

Aug. 18, 2020 (KR) ........................ 10-2020-0103308

(51) Int. Cl.
*H01L 23/498* (2006.01)
*H01L 23/00* (2006.01)
(Continued)

(52) U.S. Cl.
CPC ...... *H01L 23/49838* (2013.01); *H01L 21/481* (2013.01); *H01L 21/4857* (2013.01); *H01L 23/49822* (2013.01); *H01L 24/13* (2013.01); *H01L 24/16* (2013.01); *H01L 24/17* (2013.01); *H01L 24/81* (2013.01); *H01L 21/561* (2013.01); *H01L 21/563* (2013.01); *H01L 23/3107* (2013.01); *H01L 24/73* (2013.01); *H01L 25/18* (2013.01); *H01L 2224/13016* (2013.01); *H01L 2224/1355* (2013.01); *H01L 2224/13541* (2013.01); *H01L 2224/1607* (2013.01);
(Continued)

(58) Field of Classification Search
CPC ............ H01L 23/49838; H01L 21/481; H01L 21/4857
See application file for complete search history.

(56) References Cited

U.S. PATENT DOCUMENTS 6,784,554 B2  8/2004  Kajiwara et al.
7,312,529 B2  12/2007  Clevenger et al.
(Continued)

FOREIGN PATENT DOCUMENTS

JP      2015041743 A    3/2015

*Primary Examiner* — Errol V Fernandes
(74) *Attorney, Agent, or Firm* — Muir Patent Law, PLLC

(57) ABSTRACT

Disclosed are semiconductor packages and methods of fabricating the same. The semiconductor package comprises a redistribution substrate including dielectric and redistribution patterns, a first substrate pad on the redistribution substrate and penetrating the dielectric pattern to be coupled to the redistribution pattern, a second substrate pad the redistribution substrate and spaced apart from the first substrate pad, a semiconductor chip on the redistribution substrate, a first connection terminal connecting the first substrate pad to one of chip pads of the semiconductor chip, and a second connection terminal connecting the second substrate pad to another one of the chip pads of the semiconductor chip. A top surface of the second substrate pad is located at a higher level than that of a top surface of the first substrate pad. A width of the second substrate pad is less than that of the first substrate pad.

20 Claims, 12 Drawing Sheets

(51) Int. Cl.
*H01L 21/48* (2006.01)
*H01L 25/18* (2023.01)
*H01L 21/56* (2006.01)
*H01L 23/31* (2006.01)

(52) U.S. Cl.
CPC ............... *H01L 2224/16013* (2013.01); *H01L 2224/16227* (2013.01); *H01L 2224/16238* (2013.01); *H01L 2224/17055* (2013.01); *H01L 2224/17517* (2013.01); *H01L 2224/73204* (2013.01); *H01L 2224/81345* (2013.01); *H01L 2224/81815* (2013.01)

(56) References Cited

U.S. PATENT DOCUMENTS

| | | |
|---|---|---|
| 8,492,197 B2 | 7/2013 | Cho et al. |
| 9,355,977 B2 | 5/2016 | Lin et al. |
| 9,515,039 B2 | 12/2016 | Lai et al. |
| 2016/0005707 A1 | 1/2016 | Kwon et al. |
| 2017/0207205 A1* | 7/2017 | Kim ..................... H01L 24/20 |
| 2018/0151495 A1 | 5/2018 | Hsu et al. |

* cited by examiner

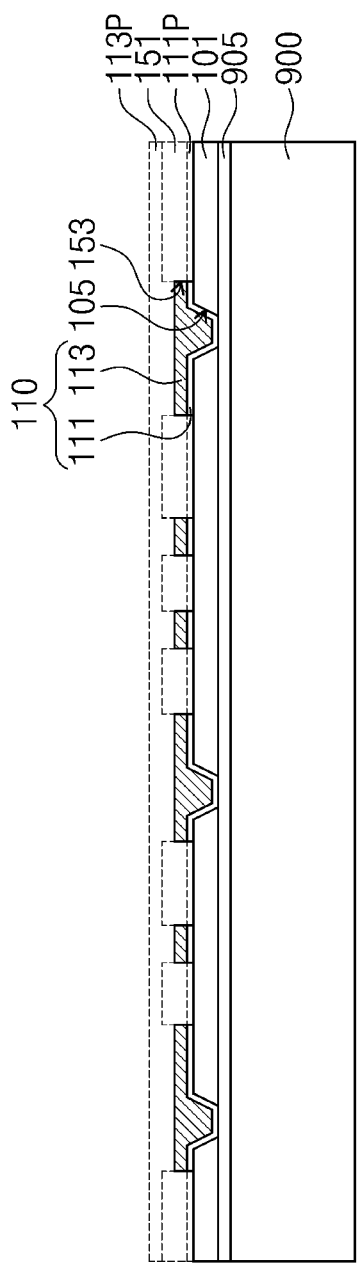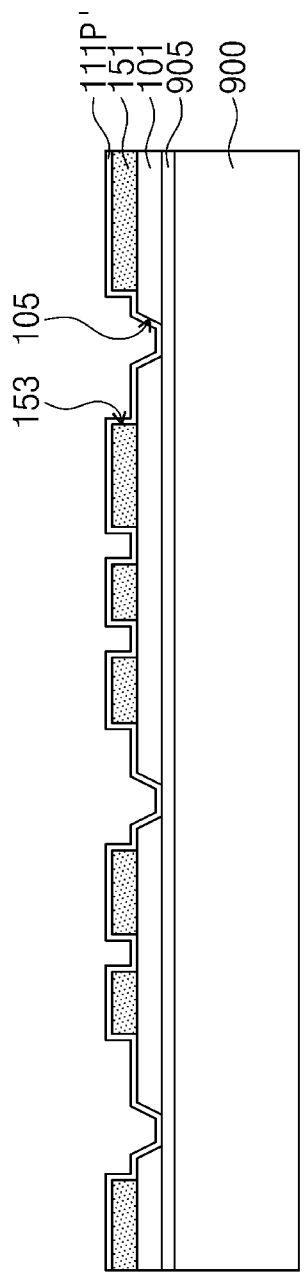

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2020-0103308, filed on Aug. 18, 2020, in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a redistribution substrate and a method of fabricating the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some example embodiments of the present inventive concepts provide a semiconductor package whose structural stability is improved and a method of fabricating the same.

Some example embodiments of the present inventive concepts provide a semiconductor package whose durability and reliability are increased and a method of fabricating the same.

Some example embodiments of the present inventive concepts provide a method of fabricating a semiconductor package in which method the occurrence of defects is reduced.

An object of the present inventive concepts is not limited to the mentioned above, and other objects which have not been mentioned above will be clearly understood to those skilled in the art from the following description.

According to some example embodiments of the present inventive concepts, a semiconductor package may comprise: a redistribution substrate that includes a dielectric pattern and a redistribution pattern in the dielectric pattern; a first substrate pad on a top surface of the redistribution substrate, the first substrate pad penetrating the dielectric pattern and being coupled to the redistribution pattern; a second substrate pad on the top surface of the redistribution substrate and spaced apart from the first substrate pad; a semiconductor chip on the redistribution substrate; a first connection terminal that connects the first substrate pad to one of chip pads of the semiconductor chip; and a second connection terminal that connects the second substrate pad to another one of the chip pads of the semiconductor chip. A top surface of the second substrate pad may be located at a level higher than a level of a top surface of the first substrate pad. A width of the second substrate pad may be less than a width of the first substrate pad.

According to some example embodiments of the present inventive concepts, a method of fabricating a semiconductor package may comprise: forming a redistribution substrate that includes a dielectric pattern and a redistribution pattern buried in the dielectric pattern; forming a seed layer on the redistribution substrate; forming a mask pattern on the seed layer, the mask pattern having a first opening with a first width and a second opening with a second width less than the first width; performing a plating process in which the seed layer is used as a seed to form a first substrate pad that fills the first opening and a second substrate pad that fills the second opening; removing the mask pattern and an exposed portion of the seed layer; providing a plurality of connection members on corresponding chip pads of a semiconductor chip; placing the semiconductor chip on the redistribution substrate to allow the connection members to rest on the first substrate pad and the second substrate pad; and performing on the connection members a reflow process to form a first connection terminal that connects the first substrate pad to one of the chip pads and a second connection terminal that connects the second substrate pad to another one of the chip pads.

According to some example embodiments of the present inventive concepts, a semiconductor package may comprise: a redistribution substrate that includes a plurality of first substrate pads and a plurality of second substrate pads on a top surface of the redistribution substrate, the first substrate pads extending into the redistribution substrate and being connected to a redistribution pattern of the redistribution substrate; a semiconductor chip mounted on the redistribution substrate, the semiconductor chip including a plurality of first chip pads and a plurality of second chip pads; a plurality of first connection terminals that connect the first chip pads to the first substrate pads; a plurality of second connection terminals that connect the second chip pads to the second substrate pads; a molding layer on the redistribution substrate and in which the semiconductor chip is embedded; and a plurality of external terminals on a bottom surface of the redistribution substrate. A volume of each of the first substrate pads may be substantially the same as a volume of each of the second substrate pads. A height of the first substrate pad may be less than a height of the second substrate pad. An interval between the first chip pads and the first substrate pads may be greater than an interval between the second chip pads and the second substrate pads.

BRIEF DESCRIPTION OF THE DRAWINGS

FIGS. 3 to 13 illustrate cross-sectional views showing a method of fabricating a semiconductor package, according to some example embodiments of the present inventive concepts.

DETAILED DESCRIPTION OF EMBODIMENTS

Figure 1:
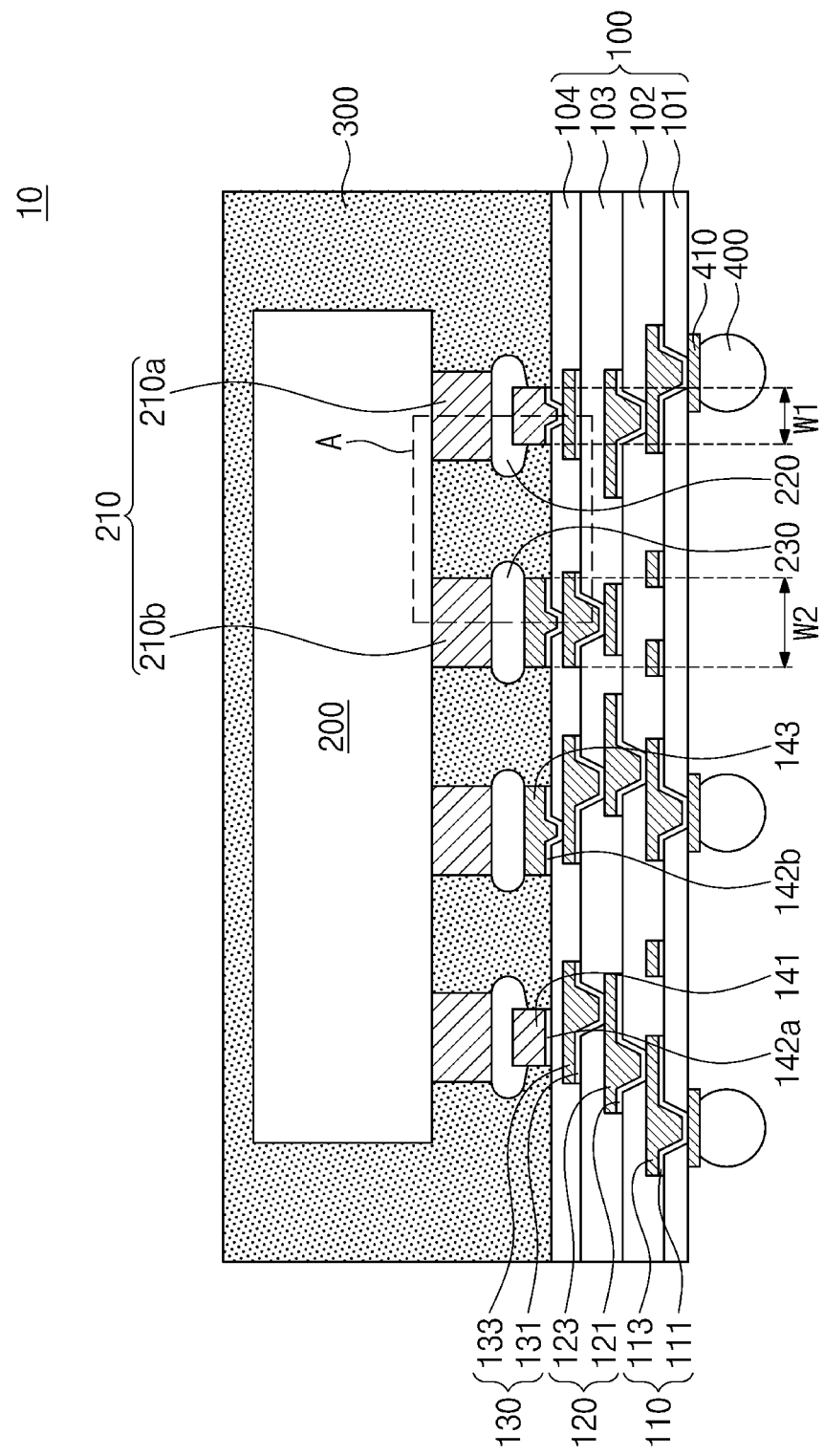
FIG. 1 illustrates a cross-sectional view showing a semiconductor package, according to some example embodiments of the present inventive concepts.

The following will now describe a semiconductor package according to the present inventive concepts with reference to the accompanying drawings. In the drawings, like numerals refer to like elements throughout.

Figure 2:
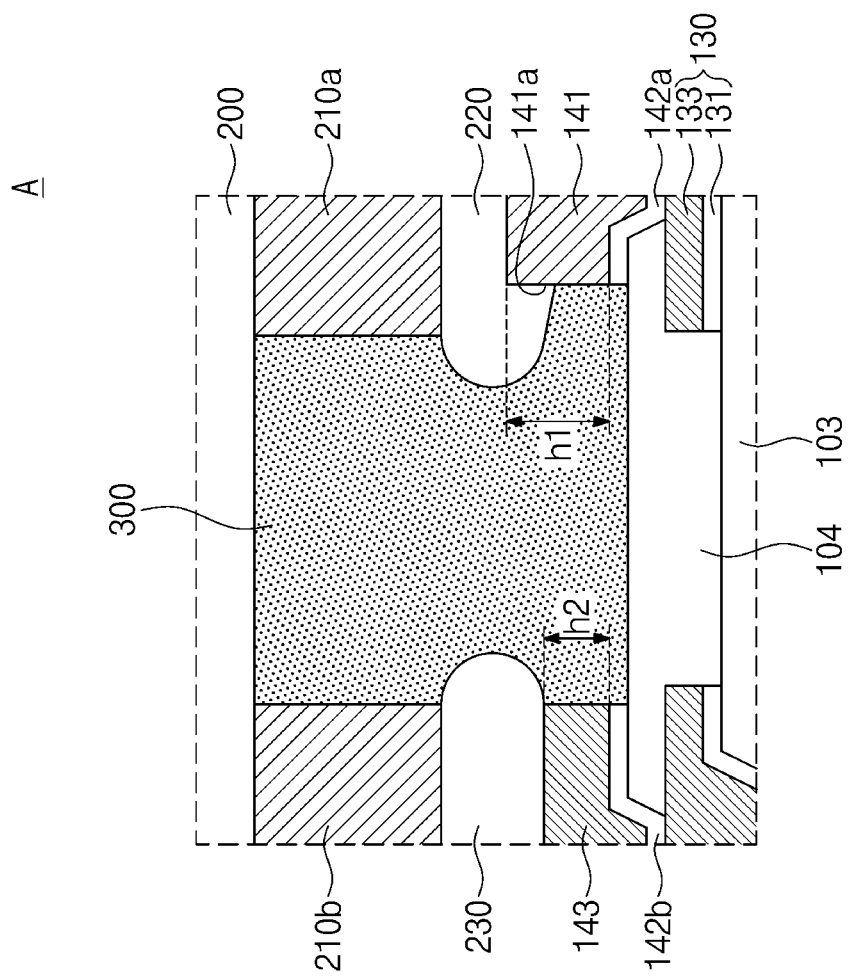
FIG. 2 illustrates an enlarged view showing section A of FIG. 1.

FIG. 1 illustrates a cross-sectional view showing a semiconductor package according to some example embodiments of the present inventive concepts. FIG. 2 illustrates an enlarged view showing section A of FIG. 1.

Referring to FIGS. 1 and 2, a semiconductor package 10 may include a redistribution substrate 100, a semiconductor chip 200, a molding layer 300, and external coupling terminals 400.

The redistribution substrate 100 may include a dielectric pattern, first, second, and third redistribution patterns 110, 120, and 130, and substrate pads 141 and 143.

The dielectric pattern may include first, second, third, and fourth dielectric layers 101, 102, 103, and 104 that are sequentially stacked. The first, second, third, and fourth dielectric layers 101, 102, 103, and 104 may include an inorganic material, such as silicon oxide ($SiO_x$), silicon nitride ($SiN_x$), or silicon oxynitride (SiON), but the present inventive concepts are not limited thereto. Alternatively, the first, second, third, and fourth dielectric layers 101, 102, 103, and 104 may include a photosensitive polymer. In this description, the photosensitive polymer may include, for example, one or more of photosensitive polyimide, polybenzoxazole, phenolic polymers, and benzocyclobutene polymers.

The first redistribution pattern 110 may be provided on the first dielectric layer 101. The first redistribution pattern 110 may include a first conductive pattern 113 and a first seed pattern 111.

The first conductive pattern 113 may extend in a direction parallel to a top surface of the first dielectric layer 101, thereby constituting an electrical circuit. A portion of the first conductive pattern 113 may be formed to have a large width and to constitute a pad part to which is coupled a via part of a second conductive pattern 123 which will be discussed below. Another portion of the first conductive pattern 113 may penetrate the first dielectric layer 101 and may constitute a via part that is exposed on a bottom surface of the first dielectric layer 101. The first conductive pattern 113 may include metal, such as copper (Cu).

The first seed pattern 111 may be interposed between the first conductive pattern 113 and the first dielectric layer 101. For example, the first seed pattern 111 may cover a bottom surface of the first conductive pattern 113 and may surround a lateral surface of the via part of the first conductive pattern 113. The first seed pattern 111 may contact a bottom surface of the first conductive pattern 113 and a top surface of the first dielectric layer 101. The first seed pattern 111 may include a conductive material, such as titanium (Ti) and/or tantalum (Ta). The first seed pattern 111 may have a thickness of about 5 Å to about 50 Å.

The first dielectric layer 101 may be provided thereon with the second dielectric layer 102 that covers the first redistribution pattern 110. For example, on the first dielectric layer 101, the first redistribution pattern 110 may be buried in the second dielectric layer 102. The second dielectric layer 102 may contact upper and side surfaces of the first redistribution pattern 110.

The second redistribution pattern 120 may be provided on the second dielectric layer 102. The second redistribution pattern 120 may contact a top surface of the second dielectric layer 102. The second redistribution pattern 120 may include a second conductive pattern 123 and a second seed pattern 121.

The second conductive pattern 123 may extend in a direction parallel to a top surface of the second dielectric layer 102, thereby constituting an electrical circuit. A portion of the second conductive pattern 123 may be formed to have a large width and to constitute a pad part to which is coupled a via part of a third conductive pattern 133 which will be discussed below. Another portion of the second conductive pattern 123 may penetrate the second dielectric layer 102 and may constitute a via part that is exposed on a bottom surface of the second dielectric layer 102. The via part of the second conductive pattern 123 that penetrates the second dielectric layer 102 may be coupled to the first conductive pattern 113. The second conductive pattern 123 may include metal, such as copper (Cu).

The second seed pattern 121 may be interposed between the second conductive pattern 123 and the second dielectric layer 102 and between the second conductive pattern 123 and the first conductive pattern 113. For example, the second seed pattern 121 may cover a bottom surface of the second conductive pattern 123 and may surround lateral and bottom surfaces of the via part of the second conductive pattern 123. The second seed pattern 121 may contact a bottom surface of the second conductive pattern 123 and upper surfaces of the second dielectric layer 102 and the first conductive pattern 113. The second seed pattern 121 may include a conductive material, such as titanium (Ti) and/or tantalum (Ta). The second seed pattern 121 may have a thickness of about 5 Å to about 50 Å.

The second dielectric layer 102 may be provided thereon with the third dielectric layer 103 that covers the second redistribution pattern 120. For example, on the second dielectric layer 102, the second redistribution pattern 120 may be buried in the third dielectric layer 103. The third dielectric layer 103 may contact upper and side surfaces of the second redistribution pattern 120.

The third redistribution pattern 130 may be provided on the third dielectric layer 103. The third redistribution pattern 130 may contact a top surface of the third dielectric layer 103. The third redistribution pattern 130 may include a third conductive pattern 133 and a third seed pattern 131.

The third conductive pattern 133 may extend in a direction parallel to a top surface of the third dielectric layer 103, thereby constitute an electrical circuit. A portion of the third conductive pattern 133 may be formed to have a large width and to constitute a pad part to which is coupled a substrate pad 141 or a substrate pad 143 which will be discussed below. Another portion of the third conductive pattern 133 may penetrate the third dielectric layer 103 and may constitute a via part that is exposed on a bottom surface of the third dielectric layer 103. The via part of the third conductive pattern 133 that penetrates the third dielectric layer 103 may be coupled to the second conductive pattern 123. The third conductive pattern 133 may include metal, such as copper (Cu).

The third seed pattern 131 may be interposed between the third conductive pattern 133 and the third dielectric layer 103 and between the third conductive pattern 133 and the second conductive pattern 123. For example, the third seed pattern 131 may cover a bottom surface of the third conductive pattern 133 and may surround lateral and bottom surfaces of the via part of the third conductive pattern 133. The third seed pattern 131 may contact a bottom surface of the third conductive pattern 133 and upper surfaces of the third dielectric layer 103 and the second conductive pattern 123. The third seed pattern 131 may include a conductive material, such as titanium (Ti) and/or tantalum (Ta). The third seed pattern 131 may have a thickness of about 5 Å to about 50 Å.

The third dielectric layer 103 may be provided thereon with the fourth dielectric layer 104 that covers the third redistribution pattern 130. For example, on the third dielectric layer 103, the third redistribution pattern 130 may be buried in the fourth dielectric layer 104. The fourth dielectric layer 104 may contact upper and side surfaces of the third redistribution pattern 130.

The redistribution substrate 100 may include substrate pads 141 and 143 provided on a top surface thereof. The substrate pads 141 and 143 may include a first substrate pad 141 and a second substrate pad 143 that are spaced apart from each other. Each of the first and second substrate pads 141 and 143 may be provided in plural. Each of the first and second substrate pads 141 and 143 may have a pillar shape formed on the top surface of the redistribution substrate 100.

The first substrate pad 141 may be provided on an outer region of the redistribution substrate 100. The first substrate pad 141 may be provided on the fourth dielectric layer 104. The first substrate pad 141 may be a dummy pad that is electrically floated from the first, second, and third redistribution patterns 110, 120, and 130 in the redistribution substrate 100. For example, as shown in FIG. 1, the first substrate pad 141 may not be connected to the third redistribution pattern 130, and the fourth dielectric layer 104 may be positioned between the first substrate pad 141 and the third redistribution pattern 130. Alternatively, differently from that shown in FIG. 1, the first substrate pad 141 may be a ground pad or a power pad for the semiconductor chip 200 mounted on the redistribution substrate 100. For example, the first substrate pad 141 may penetrate the fourth dielectric layer 104 and may be coupled to the third redistribution pattern 130. When the first substrate pad 141 is provided in plural, the plurality of first substrate pads 141 may have an interval of about 100 μm to about 200 μm therebetween.

The second substrate pad 143 may be provided on a central region of the redistribution substrate 100. The second substrate pad 143 may be provided on the fourth dielectric layer 104. The second substrate pad 143 may be a pad through which a signal is transferred to the semiconductor chip 200 mounted on the redistribution substrate 100. For example, the second substrate pad 143 may penetrate the fourth dielectric layer 104 and may be coupled to the third redistribution pattern 130. When the second substrate pad 143 is provided in plural, the plurality of second substrate pads 143 may have therebetween an interval less than that of the first substrate pads 141. For example, the interval of the second substrate pads 143 may range from about 50 μm to about 100 μm.

The first substrate pad 141 may have a top surface at a higher level than that of a top surface of the second substrate pad 143. The first substrate pad 141 may have a height h1 greater than a height h2 of the second substrate pad 143. For example, the height h1 of the first substrate pad 141 may be about 1.5 times to about 3 times the height h2 of the second substrate pad 143. The height h1 of the first substrate pad 141 may range from about 5 μm to about 10 μm, and the height h2 of the second substrate pad 143 may range from about 1 μm to about 5 μm. As used herein, height may be measured in a direction perpendicular to a top surface of the redistribution substrate 100. Terms such as "same," "equal," "planar," or "coplanar," as used herein, encompass near identicality including variations that may occur, for example, due to manufacturing processes. The term "substantially" may be used herein to emphasize this meaning, unless the context or other statements indicate otherwise.

The first substrate pad 141 may have a volume substantially the same as that of the second substrate pad 143. Since the height h1 of the first substrate pad 141 is greater than the height h2 of the second substrate pad 143, a planar area of the first substrate pad 141 may be less than that of the second substrate pad 143. The language "planar area" may be defined to refer to an area of a plane parallel to the top surface of the redistribution substrate 100, and in the present embodiment, an area of the top surface of either the first substrate pad 141 or the second substrate pad 143 may correspond to the planar area. Based on shapes (e.g., pillar shapes) of the first and second substrate pads 141 and 143, the first substrate pad 141 may have a width W1 or a diameter less than a width W2 or a diameter of the second substrate pad 143.

Fourth seed patterns 142a and 142b may be interposed between the fourth dielectric layer 104 and the first and second substrate pads 141 and 143. For example, the fourth seed patterns 142a and 142b may include a first pad seed pattern 142a provided between the first substrate pad 141 and the fourth dielectric layer 104, and a second pad seed pattern 142b provided between the second substrate pad 143 and the fourth dielectric layer 104 and between the second substrate pad 143 and the third redistribution pattern 130. In some example embodiments, when the first substrate pad 141 penetrates the fourth dielectric layer 104 and contacts the third redistribution pattern 130, the first pad seed pattern 142a may be provided between the first substrate pad 141 and the fourth dielectric layer 104 and between the first substrate pad 141 and the third redistribution pattern 130. The fourth seed patterns 142a and 142b may include a conductive material, such as titanium (Ti) and/or tantalum (Ta). The fourth seed patterns 142a and 142b may have a thickness of about 5 Å to about 50 Å.

The semiconductor chip 200 may be disposed on the redistribution substrate 100. The semiconductor chip 200 may be mounted on the redistribution substrate 100 so as to allow chip pads 210 to face the redistribution substrate 100. The chip pads 210 may be formed to have the same shape. For example, the chip pads 210 may have a pillar shape. The chip pads 210 may have a width substantially the same as or similar to that of the width W2 of the second substrate pad 143. The width of the chip pads 210 may be greater than the width W1 of the first substrate pad 141. The chip pads 210 may include a first chip pad 210a positioned on the first substrate pad 141 and a second chip pad 210b positioned on the second substrate pad 143. The first chip pad 210a may have a bottom surface at the same level as that of a bottom surface of the second chip pad 210b, and thus an interval between the first chip pad 210a and the first substrate pad 141 may be less than that between the second chip pad 210b and the second substrate pad 143.

The semiconductor chip 200 may be electrically connected to the redistribution substrate 100 through first and second connection terminals 220 and 230 provided between the chip pads 210 and the substrate pads 141 and 143. In this description, the phrase "electrically connected to" may include "directly electrically connected to" or "indirectly electrically connected to", and the phrase "electrically connected to the redistribution substrate 100" may mean that "electrically connected to one or more of the first, second, and third redistribution patterns 110, 120, and 130." The connection terminals 220 and 230 may include a first connection terminal 220 that connects the first substrate pad 141 to the first chip pad 210a, and a second connection terminal 230 that connects the second substrate pad 143 to the second chip pad 210b. The first connection terminal 220 may be in contact with the bottom surface of the first chip pad 210a and with the top surface of the first substrate pad 141. The second connection terminal 230 may be in contact with the bottom surface of the second chip pad 210b and with the top surface of the second substrate pad 143. Therefore, the first and second connection terminals 220 and 230 may have their top surfaces at the same level as that of the top surface of the redistribution substrate 100, and the first connection terminal 220 may have a bottom surface at a higher level than that of a bottom surface of the second connection terminal 230. The first connection terminal 220 may have a volume substantially the same as the of the second connection terminal 230.

The first connection terminal 220 may protrude from a lateral surface of the first chip pad 210a. For example, the first connection terminal 220 may have a width greater than that of the first chip pad 210a and the width W1 of the first substrate pad 141. The second connection terminal 230 may protrude from a lateral surface of the second chip pad 210b. For example, the second connection terminal 230 may have a width greater than that of the second chip pad 210b and the width W2 of the second substrate pad 143.

The first connection terminal 220 may have a volume substantially the same as that of the second connection terminal 230, and an interval between the first substrate pad 141 and the first chip pad 210a may be less than that between the second substrate pad 143 and the second chip pad 210b. Therefore, a portion of the first connection terminal 220 may extend toward the redistribution substrate 100 from a gap between the first substrate pad 141 and the first chip pad 210a, and thus may extend onto a lateral surface 141a of the first substrate pad 141 to thereby cover a portion of the lateral surface 141a of the first substrate pad 141. The second connection terminal 230 may not cover a lateral surface of the second substrate pad 143. Alternatively, a portion of the second connection terminal 230 may extend onto the lateral surface of the second substrate pad 143 to thereby cover a portion of the lateral surface of the second substrate pad 143. In this case, a distance from the top surface of the second substrate pad 143 to a lowermost point of the portion of the second connection terminal 230 may be less than that from the top surface of the first substrate pad 141 to a lowermost point of the portion of the first connection terminal 220. For example, a length that the second connection terminal 230 extends downwardly from the top surface of the second substrate pad 143 may be less than a length that the first connection terminal 220 extends downwardly from the top surface of the first substrate pad 141.

The molding layer 300 may be provided on the redistribution substrate 100. On the redistribution substrate 100, the molding layer 300 may cover the semiconductor chip 200. The molding layer 300 may cover the fourth dielectric layer 104. The molding layer 300 may further extend toward a gap between the semiconductor chip 200 and the redistribution substrate 100, thereby encapsulating the first and second connection terminals 220 and 230. The molding layer 300 may include a dielectric polymer, such as an epoxy molding compound (EMC). For another example, an under-fill pattern (not shown) may be provided between a gap between the redistribution substrate 100 and the semiconductor chip 200.

The redistribution substrate 100 may include on a bottom surface thereof a terminal pad 410 and an external coupling terminal 400. The external coupling terminal 400 may be disposed on a bottom surface of the first redistribution pattern 110. The terminal pad 410 may be disposed between the first redistribution pattern 110 and the external coupling terminal 400. The terminal pad 410 may include a conductive material, such as metal. The external coupling terminal 400 may be coupled to the chip pads 210 of the semiconductor chip 200 through the terminal pads 410 and the redistribution patterns 110, 120, and 130. Therefore, the external coupling terminal 400 may not be vertically aligned with the chip pads 210. The external coupling terminal 400 may be provided in plural, and at least one of the plurality of external coupling terminals 400 may not vertically overlap the semiconductor chip 200. Therefore, the external coupling terminal 400 may increase in the degree of freedom of arrangement. The external coupling terminal 400 may include a conductive material, such as metal. The external coupling terminal 400 may include at least one selected from solder, pillar, and bump. The semiconductor package 10 may be a fan-out semiconductor package.

FIGS. 3 to 14 illustrate cross-sectional views showing a method of fabricating a semiconductor package according to some example embodiments of the present inventive concepts. In the embodiment that follows, a detailed description of technical features repetitive to those discussed above with reference to FIGS. 1 and 2 will be omitted, and a difference thereof will be discussed in detail. The same components as those of the semiconductor package discussed above will be allocated the same reference numerals thereto.

Figure 3:
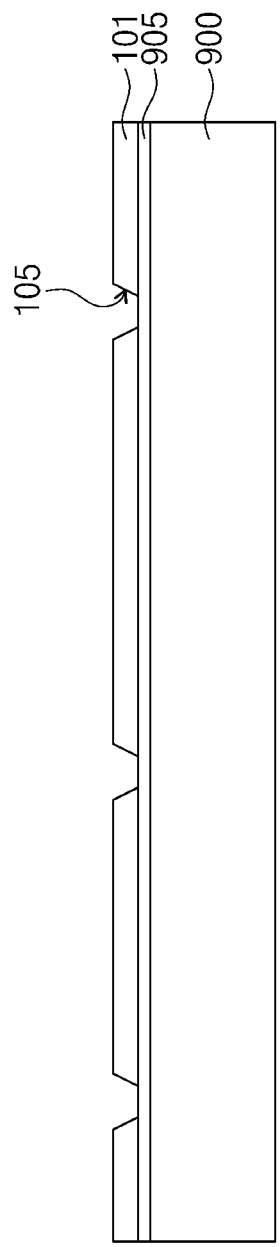

Referring to FIG. 3, a first dielectric layer 101 may be formed on a carrier substrate 900. A carrier adhesive layer 905 may further be interposed between the carrier substrate 900 and the first dielectric layer 101. The carrier adhesive layer 905 may attach the first dielectric layer 101 to the carrier substrate 900. In the following description, the phrase "a certain component is formed or provided on the carrier substrate" may include "the carrier adhesive layer 905 is further interposed between the certain component and the carrier substrate 900." The phrase "the carrier substrate 900 is exposed" may include that the carrier adhesive layer 905 is exposed. In some example embodiments, the first dielectric layer 101 may be formed by a coating process such as spin coating or slit coating. The first dielectric layer 101 may include, for example, a photosensitive polymer. In this description, the photosensitive polymer may include, for example, one or more of photosensitive polyimide, polybenzoxazole, phenolic polymers, and benzocyclobutene polymers.

The first dielectric layer 101 may be patterned to form first holes 105 in the first dielectric layer 101. The first holes 105 may expose the carrier substrate 900 or the carrier adhesive layer 905. The patterning of the first dielectric layer 101 may be performed by exposure and development processes. The exposure process may be a negative tone exposure process or a positive tone exposure process. Afterwards, a curing process may be performed on the first dielectric layer 101.

Figure 4:
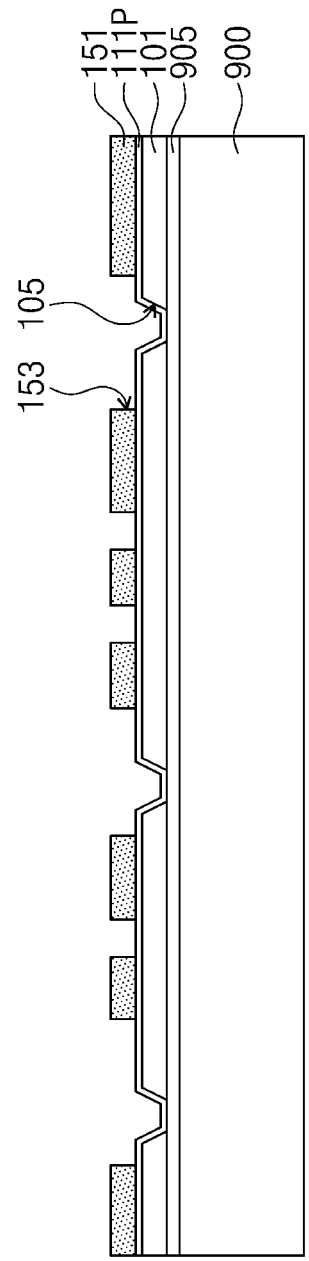

Referring to FIG. 4, a first seed layer 111P may be formed on the first dielectric layer 101. The first seed layer 111P may cover a top surface of the first dielectric layer 101. The first seed layer 111P may extend into the first holes 105 formed in the first dielectric layer 101. The first seed layer 111P may conformally cover a bottom surface and a sidewall of each of the first holes 105. The bottom surfaces of the first holes 105 may correspond to the carrier substrate 900 or the carrier adhesive layer 905 exposed by the first dielectric layer 101. The first seed layer 111P may include a conductive material. For example, the first seed layer 111P may include one or more of titanium and tantalum.

A first resist pattern 151 may be formed on the first dielectric layer 101. The first resist pattern 151 may be formed on the first seed layer 111P. The first resist pattern 151 may have first trenches 153. The first trenches 153 may be spatially connected to the first holes 105. The first trenches 153 may at least partially expose a top surface of the first seed layer 111P. The first resist pattern 151 may include a material different from that of the first dielectric layer 101. For example, the first resist pattern 151 may include a photoresist material. The photoresist material may include an organic material, such as polymer.

Referring to FIG. 5, a first conductive layer 113P may be formed to lie on the first seed layer 111P and to fill the first holes 105 and the first trenches 153. The first conductive layer 113P may be formed by performing an electroplating process in which the first seed layer 111P is used as an electrode. The first conductive layer 113P may include metal, such as copper. The first conductive layer 113P may extend onto a top surface of the first resist pattern 151.

The first conductive layer 113P may undergo a planarization process to form a first conductive pattern 113. The planarization process may include, for example, a chemical mechanical polishing process. The planarization process may continue until the top surface of the first resist pattern 151 is exposed. The planarization process may remove the first conductive layer 113P from the top surface of the first resist pattern 151, thereby forming the first conductive pattern 113. The first conductive pattern 113 may be localized in the first holes 105 and the first trenches 153.

The first resist pattern 151 may be removed to expose the top surface of the first seed layer 111P and a sidewall of the first conductive pattern 113. A strip process may be used to remove the first resist pattern 151.

Afterwards, an exposed portion of the first seed layer 111P may be removed to form a first seed pattern 111. The first seed pattern 111 may remain between the first conductive pattern 113 and the first dielectric layer 101. Accordingly, a first redistribution pattern 110 may be formed. The first redistribution pattern 110 may include the first seed pattern 111 and the first conductive pattern 113. As a result of the planarization process, the first redistribution pattern 110 may have a relatively flat top surface.

According to some example embodiments, the first seed pattern 111 may be formed to cover the sidewall of the first conductive pattern 113.

Referring to FIG. 6, before a first seed layer 111P' is formed as discussed below, a first resist pattern 151 may be formed on the first dielectric layer 101. The first resist pattern 151 may have first trenches 153. The first resist pattern 151 may include a material different from that of the first dielectric layer 101. For example, the first resist pattern 151 may include a photoresist material. The photoresist material may include an organic material such as polymer.

A first seed layer 111P' may be formed in the first holes 105 and the first trenches 153. The first seed layer 111P' may conformally cover a bottom surface and a sidewall of each of the first holes 105, a bottom surface and a sidewall of each of the first trenches 153, and a top surface of the first resist pattern 151. The bottom surfaces of the first holes 105 may correspond to the carrier substrate 900 or the carrier adhesive layer 905 exposed by the first dielectric layer 101. The bottom surfaces of the first trenches 153 may correspond to an exposed top surface of the first dielectric layer 101, and the sidewalls of the first trenches 153 may correspond to an inner wall of the first resist pattern 151. The first seed layer 111P' may include a conductive material.

Figure 7:
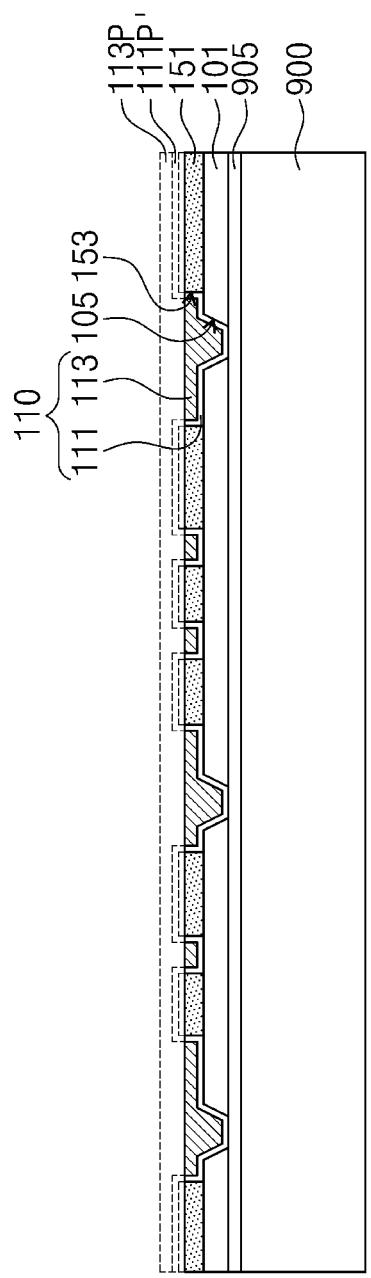

Referring to FIG. 7, a first conductive layer 113P may be formed on the first seed layer 111P', thereby filling the first holes 105 and the first trenches 153. The first conductive layer 113P may be formed by performing an electroplating process in which the first seed layer 111P' is used as an electrode. The first conductive layer 113P may include metal, such as copper. The first conductive layer 113P may extend onto a top surface of the first resist pattern 151.

The first seed layer 111P' and the first conductive layer 113P may undergo a planarization process to form a first seed pattern 111 and a first conductive pattern 113. The planarization process may include, for example, a chemical mechanical polishing process. The planarization process may continue until the top surface of the first resist pattern 151 is exposed. The planarization process may the first seed layer 111P' and the first conductive layer 113P from the top surface of the first resist pattern 151, thereby forming a first seed pattern 111 and a first conductive pattern 113. The first seed pattern 111 and the first conductive pattern 113 may be localized in the first hole 105 and the first trench 153, respectively. Accordingly, a first redistribution pattern 110 may be formed.

Although not shown, the first resist pattern 151 is subsequently removed to expose a top surface of the first dielectric layer 101 and a sidewall of the first redistribution pattern 110. The sidewall of the first redistribution pattern 110 may correspond to an outer wall of the first seed pattern 111. A strip process may be used to remove the first resist pattern 151.

The following description will focus on the example of FIGS. 3 to 5.

Figure 8:
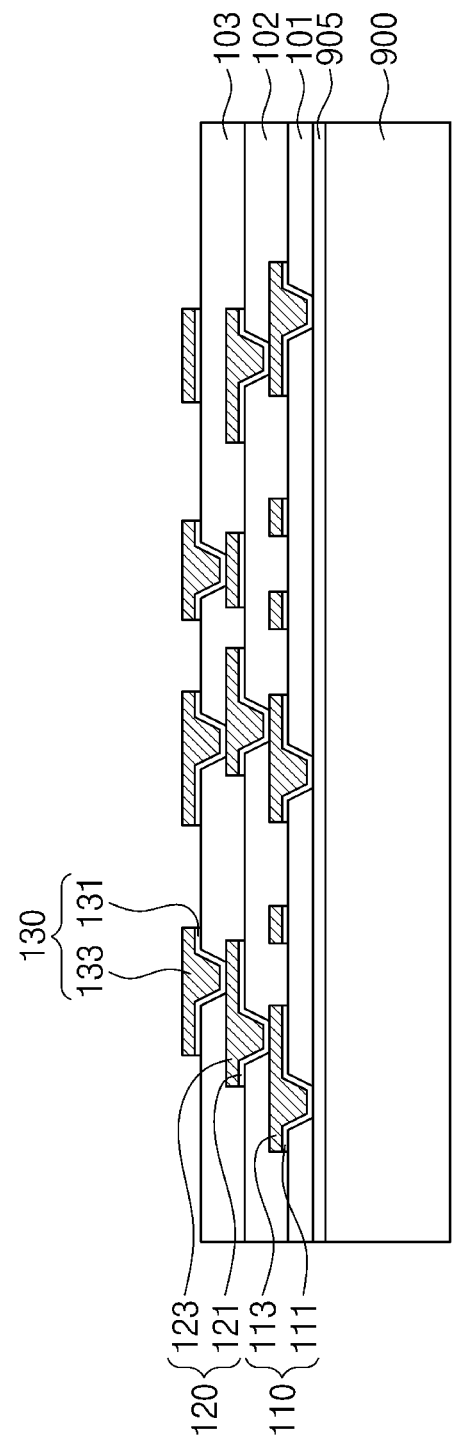

Referring to FIG. 8, a second dielectric layer 102 may be formed on the first dielectric layer 101. The second dielectric layer 102 may cover the first redistribution pattern 110. The second dielectric layer 102 may include, for example, a photosensitive polymer. The first and second dielectric layers 101 and 102 may have an indistinct boundary therebetween, but the present inventive concepts are not limited thereto.

A second redistribution pattern 120 may be formed on the second dielectric layer 102. The formation of the second redistribution pattern 120 may be substantially the same as the formation of the first redistribution pattern 110. For example, second holes may be formed in the second dielectric layer 102, and the top surface of the first redistribution pattern 110 may be exposed to the second holes. A second resist pattern may be formed on the second dielectric layer 102. Second trenches may be formed in the second resist pattern. At least a portion of the second trenches may overlap the second holes. A second seed layer may be formed on the second resist pattern. The second seed layer may conformally cover a bottom surface and a sidewall of each of the second holes, a bottom surface and a sidewall of each of the second trenches, and a top surface of the second resist pattern. A second conductive layer may be formed on the second seed layer, thereby filling the second holes and the second trenches. The second seed layer and the second conductive layer may undergo a planarization process to form a second seed pattern 121 and a second conductive pattern 123. Accordingly, the second redistribution pattern 120 may be formed.

Afterwards, the second resist pattern may be removed to expose a top surface of the second dielectric layer 102 and a sidewall of the second redistribution pattern 120. A strip process may be used to remove the second resist pattern.

A third dielectric layer 103 may be formed on the second dielectric layer 102. The third dielectric layer 103 may cover the second redistribution pattern 120. The third dielectric layer 103 may include, for example, a photosensitive polymer. The second and third dielectric layers 102 and 103 may have an indistinct boundary therebetween, but the present inventive concepts are not limited thereto.

A third redistribution pattern 130 may be formed on the third dielectric layer 103. The formation of the third redistribution pattern 130 may be substantially the same as the formation of the first redistribution pattern 110 and/or the formation of the second redistribution pattern 120. For example, third holes may be formed in the third dielectric layer 103, and the top surface of the second redistribution pattern 120 may be exposed to the third holes. A third resist pattern may be formed on the third dielectric layer 103. Third trenches may be formed in the third resist pattern. At least a portion of the third trenches may overlap the third holes. A third seed layer may be formed on the third resist pattern. The third seed layer may conformally cover a bottom surface and a sidewall of each of the third holes, a bottom surface and a sidewall of each of the third trenches, and a top surface of the third resist pattern. A third conductive layer may be formed on the third seed layer, thereby filling the third holes and the third trenches. The third seed layer and the third conductive layer may undergo a planarization process to form a third seed pattern 131 and a third conductive pattern 133. Accordingly, the third redistribution pattern 130 may be formed.

Afterwards, the third resist pattern may be removed to expose a top surface of the third dielectric layer 103 and a sidewall of the third redistribution pattern 130. A strip process may be used to remove the third resist pattern.

Figure 9:
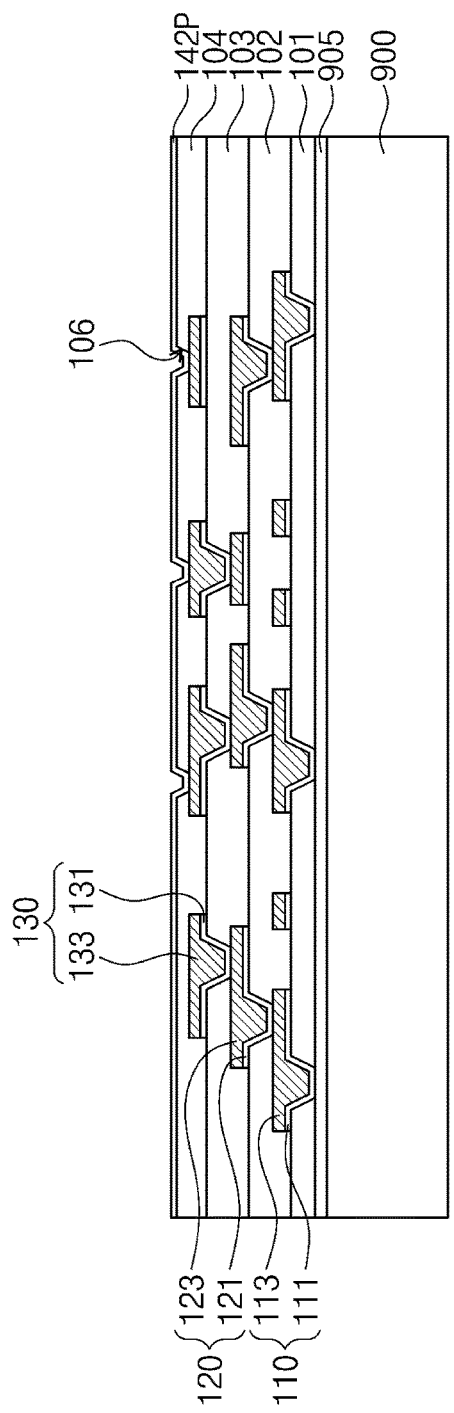

Referring to FIG. 9, a fourth dielectric layer 104 may be formed on the third dielectric layer 103. The fourth dielectric layer 104 may cover the third redistribution pattern 130. The fourth dielectric layer 104 may include, for example, a photosensitive polymer. The third and fourth dielectric layers 103 and 104 may have an indistinct boundary therebetween, but the present inventive concepts are not limited thereto. Fourth holes 106 may be formed in the fourth dielectric layer 104, thereby exposing a top surface of the third redistribution pattern 130. After the formation of the fourth holes 106, a curing process may be performed on the fourth dielectric layer 104.

A fourth seed layer 142P may be formed on the fourth dielectric layer 104. The fourth seed layer 142P may cover a top surface of the fourth dielectric layer 104. The fourth seed layer 142P may extend into the fourth holes 106 formed in the fourth dielectric layer 104. The fourth seed layer 142P may conformally cover a bottom surface and a sidewall of each of the fourth holes 106. The bottom surfaces of the fourth holes 106 may correspond to the third redistribution pattern 130 exposed by the fourth dielectric layer 104. The fourth seed layer 142P may include a conductive material. For example, the fourth seed layer 142P may include one or more of titanium and tantalum.

Figure 10:
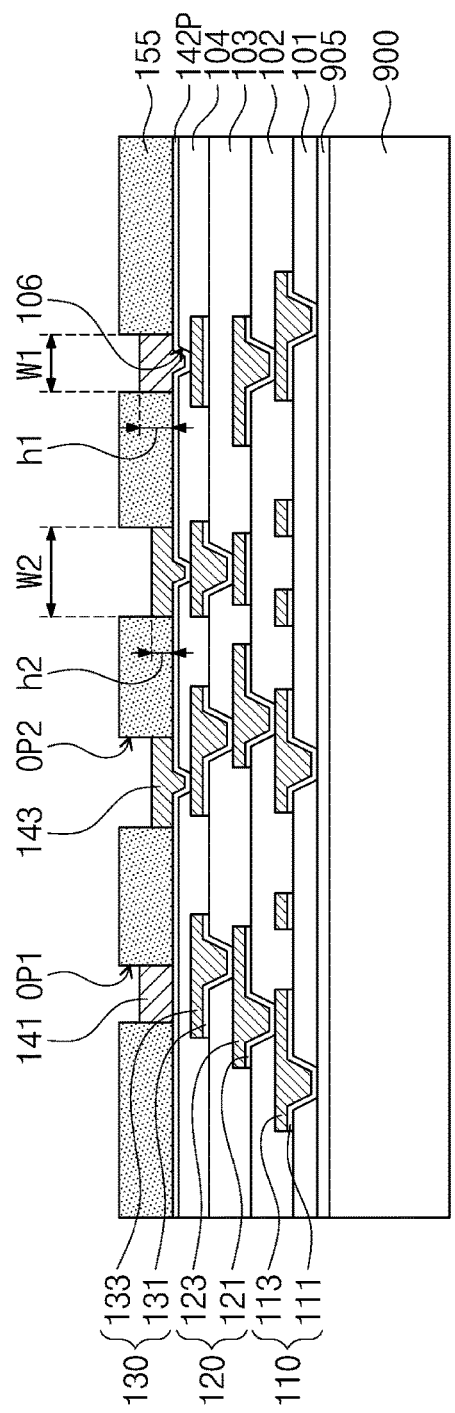

Referring to FIG. 10, a mask pattern 155 may be formed on the fourth seed layer 142P. The mask pattern 155 may have a thickness of equal to or greater than about 10 μm. A first opening OP1 and a second opening OP2 may be formed on the mask pattern 155, and thus the fourth seed layer 142P may be exposed to the first and second openings OP1 and OP2. The second opening OP2 may overlap the fourth hole 106. The first opening OP1 may not overlap the fourth hole 106. Each of the first and second opening OP1 and OP2 may be provided in plural. When the first opening OP1 is provided in plural, one of the plurality of first openings OP1 may overlap the fourth hole 106. The first opening OP1 may be formed to have a width W1 less than a width W2 of the second opening OP2.

A first substrate pad 141 may be formed in the first opening OP1, and a second substrate pad 143 may be formed in the second opening OP2. In the first opening OP1, the first substrate pad 141 may cover the fourth seed layer 142P, and in the second opening OP2, the second substrate pad 143 may cover the fourth seed layer 142P. The first and second substrate pads 141 and 143 may be formed by performing an electroplating process in which the fourth seed layer 142P is used as an electrode. The first substrate pad 141 may fill the first opening OP1, and the second substrate pad 143 may fill the second opening OP2. The first and second substrate pads 141 and 143 may be formed by the same plating process for the same time duration, and an amount of metallic material that fills the first opening OP1 may be the same as that of metallic material that fills the second opening OP2. For example, the first substrate pad 141 may have a volume substantially the same as that of the second substrate pad 143. The first opening OP1 may have a width W1 less than a width W2 of the second opening OP2, and thus the first substrate pad 141 may be formed to have a height h1 greater than a height h2 of the second substrate pad 143. According to the present inventive concepts, a single process may be performed to form the first and second substrate pads 141 and 143 having different heights from each other, and it may not be required that a separate process be performed to change a height of any one substrate pad or to form a substrate pad having a different height. As a result, it may be possible to simplify methods of fabricating semiconductor packages.

The first and second substrate pads 141 and 143 may fill the first and second openings OP1 and OP2, respectively, and may not extend onto a top surface of the mask pattern 155. Therefore, a planarization process may not be performed separately. The first and second substrate pads 141 and 143 may include metal, such as copper.

Figure 11:
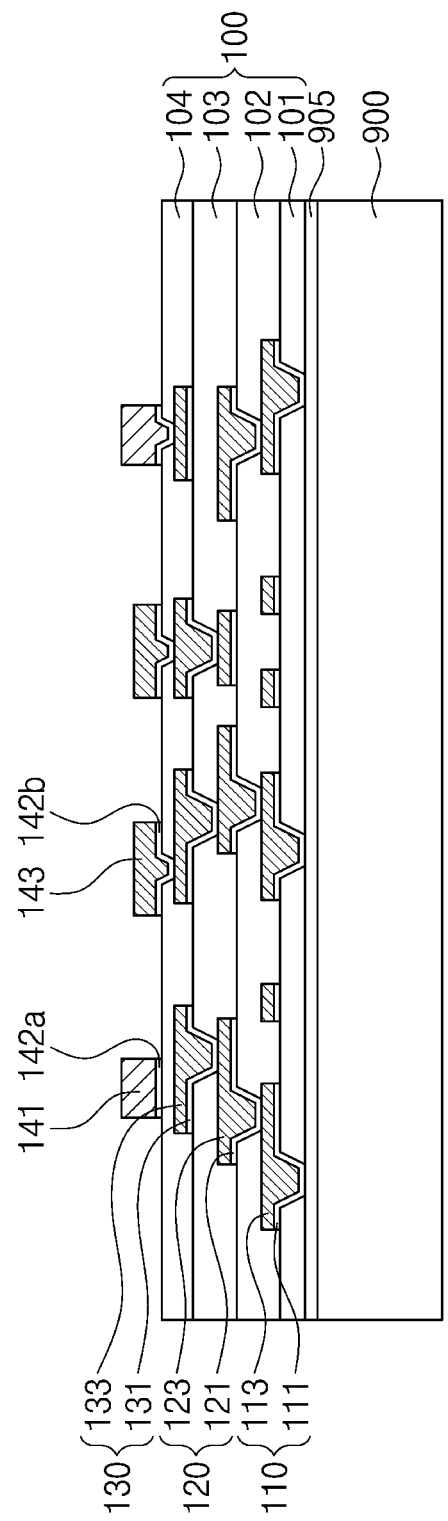

Referring to FIG. 11, the mask pattern 155 may be removed to expose a top surface of the fourth seed layer 142P, a sidewall of the first substrate pad 141, and a sidewall of the second substrate pad 143. A strip process may be used to remove the mask pattern 155.

Thereafter, an exposed portion of the fourth seed layer 142P may be removed to form a first pad seed pattern 142a and a second pad seed pattern 142b. The first pad seed pattern 142a may remain between the first substrate pad 141 and the fourth dielectric layer 104. For example, the first pad seed pattern 142a may contact a bottom surface of the first substrate pad 141 and a top surface of the fourth dielectric layer 104. The second pad seed pattern 142b may remain between the second substrate pad 143 and the fourth dielectric layer 104 and between the second substrate pad 143 and the third redistribution pattern 130. For example, the second pad seed pattern 142b may contact a bottom surface of the second substrate pad 143 and upper surfaces of the fourth dielectric layer 104 and the third redistribution pattern 130.

Through the processes mentioned above, a redistribution substrate 100 may be formed.

Figure 12:
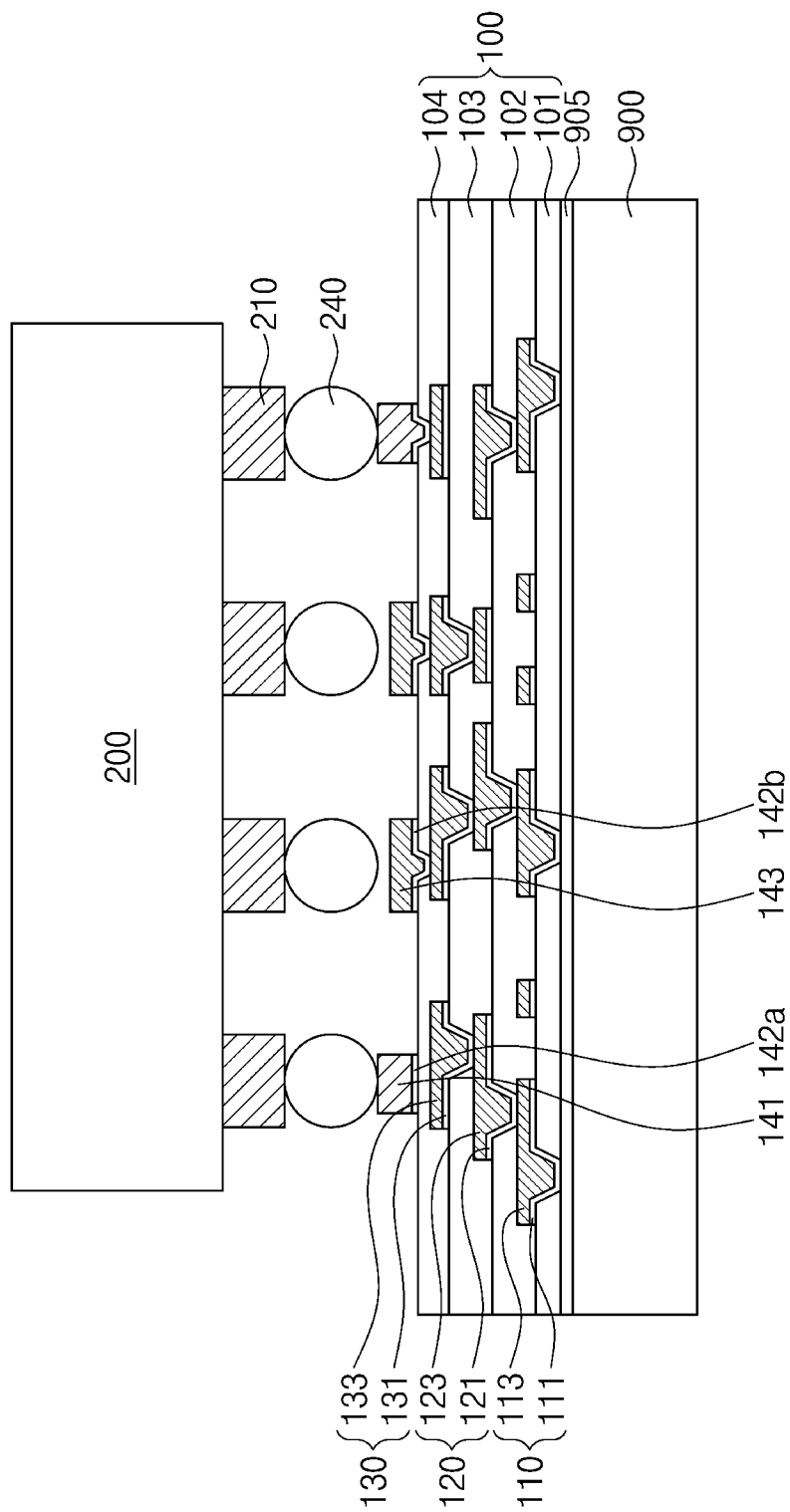

Referring to FIG. 12, a semiconductor chip 200 may be mounted on the redistribution substrate 100. The semiconductor chip 200 may include a semiconductor substrate, integrated circuits on the semiconductor substrate, wiring lines coupled to the integrated circuits, and chip pads 210 coupled to the wiring lines. The chip pads 210 may be provided on a first surface of the semiconductor chip 200. The first surface may correspond to a bottom surface of the semiconductor chip 200. Each of the chip pads 210 may have the same shape, and may have their bottom surfaces having the same area. The chip pads 210 may have a width the same as or similar to that of the second substrate pad 143 and greater than that of the first substrate pad 141. The chip pads 210 may include metal, such as aluminum. The chip pads 210 may be electrically connected through the wiring lines to the integrated circuits of the semiconductor chip 200. The phrase "electrically connected/coupled" may include "directly connected/coupled" or "indirectly connected/coupled through other conductive component(s)." The integrated circuits of the semiconductor chip 200 may include transistors. The semiconductor chip 200 may be disposed on the redistribution substrate 100 to allow the chip pads 210 to face the redistribution substrate 100. In such cases, the chip pads 210 of the semiconductor chip 200 may be aligned with the first and second substrate pads 141 and 143.

Connection members 240 may be provided on the chip pads 210 of the semiconductor chip 200. The connection members 240 may be correspondingly formed on the bottom surfaces of the chip pads 210. For example, the connection members 240 may be formed by attaching soldering members, such as solder balls, to the bottom surfaces of the chip pads 210. As the bottom surfaces of the chip pads 210 have the same area as each other, the connection members 240 attached to the chip pads 210 may have the same volume as each other.

The semiconductor chip 200 may be disposed on the redistribution substrate 100. For example, the semiconductor chip 200 may be positioned on the redistribution substrate 100 so as to allow the connection members 240 to align with the first and second substrate pads 141 and 143. In this case, as the first substrate pad 141 has its height greater than that of the second substrate pad 143, the connection members 240 may contact the first substrate pad 141, but may not contact the second substrate pad 143.

Figure 13:
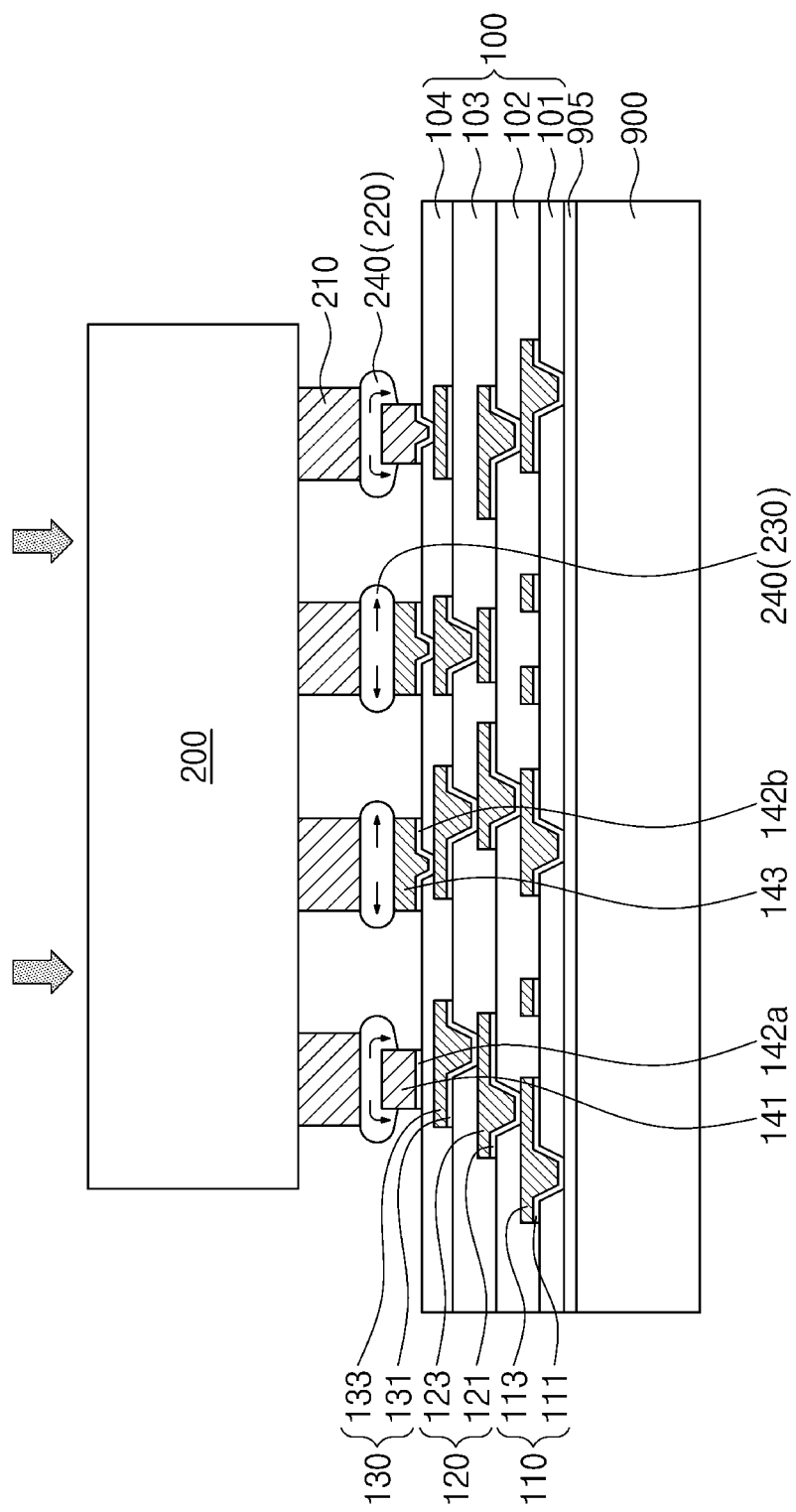

Referring to FIG. 13, the semiconductor chip 200 may be mounted on the redistribution substrate 100. For example, the semiconductor chip 200 may be disposed on the redistribution substrate 100 so as to allow the connection members 240 to contact the first and second substrate pads 141 and 143, and a reflow process may be performed on the connection members 240. In the reflow process, the connection member 240 between the chip pad 210 and the first substrate pad 141 may be melted to connect the chip pad 210 to the first substrate pad 141, and the connection member 240 between the chip pad 210 and the second substrate pad 143 may be melted to connect the chip pad 210 to the second substrate pad 143. When the reflow process is performed, the semiconductor chip 200 may be supplied with a pressure toward the redistribution substrate 100 so as to easily couple the chip pads 210 to either the first substrate pads 141 or the second substrate pads 143.

The pressure may cause the connection member 240, which is melted between the chip pad 210 and the second substrate pad 143, to extend toward one side of the second substrate pad 143 and to contact an entire top surface of the second substrate pad 143. The pressure may cause a portion of the connection member 240 to protrude onto a lateral surface of the second substrate pad 143.

When the semiconductor chip 200 is supplied with an excessive pressure, a small interval may be provided between the chip pad 210 and the second substrate pad 143, and the melted connection member 240 may have a large amount of protrusion that projects onto the lateral surface of the second substrate pad 143 (see arrows depicted in FIG. 13). In this case, a bridge phenomenon may occur in which neighboring connection members 240 contact each other, and an electrical short may arise in the semiconductor chip 200 or the redistribution substrate 100.

According to some example embodiments of the present inventive concepts, the first substrate pad 141 may be provided as a dummy pad whose height is greater than that of the second substrate pad 143, and the first substrate pad 141 may not allow that the semiconductor chip 200 and the redistribution substrate 100 approach each other within a certain distance. For example, even when the semiconductor chip 200 is supplied with an excessive pressure, a certain gap may be formed between the chip pads 210 and the second substrate pads 143, and the connection member 240 may have a small amount of protrusion that projects onto the lateral surface of the second substrate pad 143. Therefore, no bridge phenomenon may occur between neighboring second substrate pads 143.

According to some example embodiments of the present inventive concepts, the first substrate pad 141 may have a width less than those of the chip pads 210. Therefore, when an excessive pressure is applied to the semiconductor chip 200, the melted connection member 240 that protrudes onto the lateral surface of the first substrate pad 141 may flow in a direction (designated by an arrow in FIG. 13) toward the redistribution substrate 100 along the lateral surface of the first substrate pad 141. For example, the chip pads 210 may downwardly pressure the melted connection member 240 on one side of the first substrate pad 141, and the melted connection member 240 may extend to partially cover the lateral surface of the first substrate pad 141. Therefore, between the first substrate pad 141 and the chip pad 210, there may be no large length by which the connection member 240 protrudes onto the lateral surface of the first substrate pad 141, and the connection member 240 may not contact an adjacent connection member 240.

Moreover, because not only the second substrate pad 143 but also the first substrate pad 141 is used to mount the semiconductor chip 200 on the redistribution substrate 100, the semiconductor chip 200 may be rigidly mounted on the redistribution substrate 100 and a semiconductor package may be fabricated to have increased structural stability.

The reflow process may form a first connection terminal 220 between the first substrate pad 141 and the chip pad 210, and may also form a second connection terminal 230 between the second substrate pad 143 and the chip pad 210.

Referring back to FIG. 1, a molding layer 300 may be formed on the redistribution substrate 100, thereby covering the semiconductor chip 200. The molding layer 300 may cover the fourth dielectric layer 104. The molding layer 300 may further extend toward a gap between the semiconductor chip 200 and the redistribution substrate 100, thereby encapsulating the first and second connection terminals 220 and 230. The molding layer 300 may include a dielectric polymer, for example, an epoxy molding compound (EMC). For another example, an under-fill pattern (not shown) may be provided between a gap between the redistribution substrate 100 and the semiconductor chip 200. Afterwards, the carrier substrate 900 and the carrier adhesive layer 905 may be removed to expose a bottom surface of the redistribution substrate 100, for example, to expose the first dielectric layer 101. In this case, a portion of the first redistribution pattern 110 may further be exposed.

A terminal pad 410 and an external coupling terminal 400 may be formed on the bottom surface of the redistribution substrate 100. The external coupling terminal 400 may be formed on an exposed bottom surface of the first redistribution pattern 110. The terminal pad 410 may be disposed between the first redistribution pattern 110 and the external coupling terminal 400. The terminal pad 410 may include a conductive material, such as metal. The external coupling terminal 400 may be coupled to the chip pad 210 through the terminal pad 410 and the redistribution patterns 110, 120, and 130. Therefore, the external coupling terminal 400 and the chip pad 210 may not be aligned with each other in a vertical direction. The external coupling terminal 400 may be provided in plural, and at least one of the plurality of external coupling terminals 400 may not vertically overlap the semiconductor chip 200. Therefore, the external coupling terminals 400 may increase in the degree of freedom of arrangement. The external coupling terminal 400 may include a conductive material, such as metal. The external coupling terminal 400 may include at least one selected from solder, pillar, and bump. Through the processes discussed above, a semiconductor package 10 may be eventually fabricated. The semiconductor package 10 may be a fan-out semiconductor package.

Figure 14:
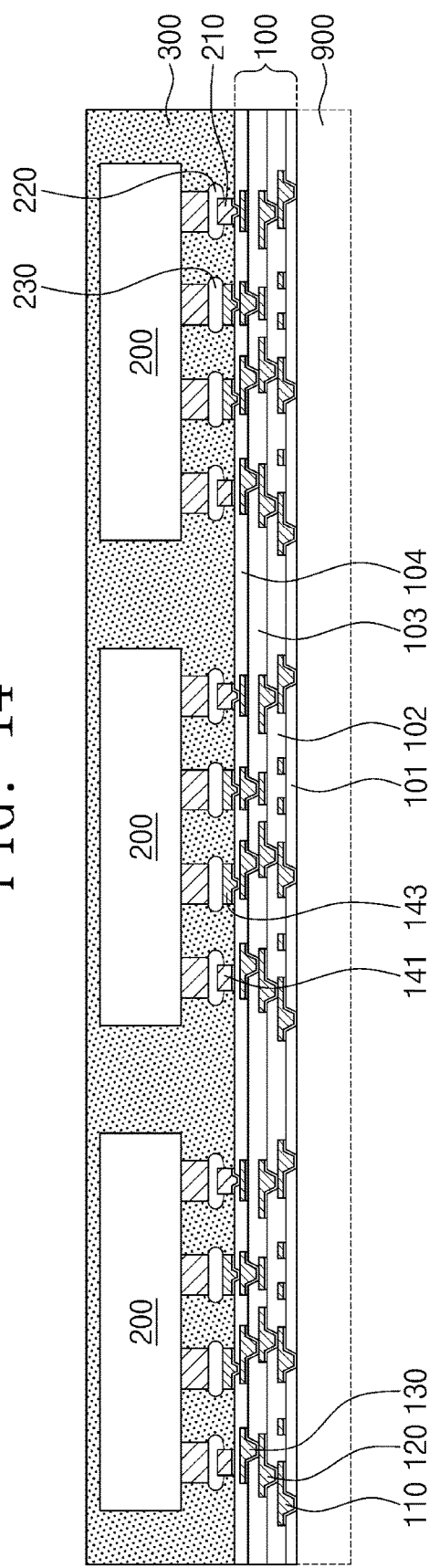
FIGS. 14 and 15 illustrate cross-sectional views showing a method of fabricating a semiconductor package, according to some example embodiments of the present inventive concepts.
Figure 15:
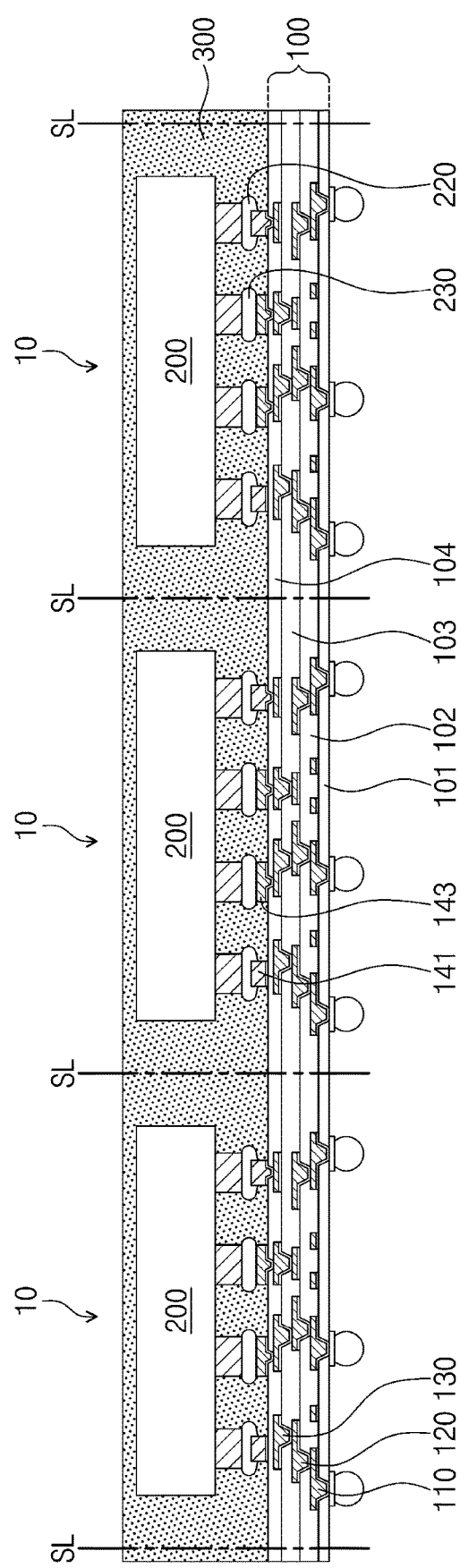

FIGS. 14 and 15 illustrate cross-sectional views showing a method of fabricating a semiconductor package according to some example embodiments of the present inventive concepts. Duplicate descriptions will be omitted below.

Referring to FIG. 14, a redistribution substrate 100 may be formed on a carrier substrate 900. The redistribution substrate 100 may include first, second, third, and fourth dielectric layers 101, 102, 103, and 104; first, second, and third redistribution patterns 110, 120, and 130; and first and second substrate pads 141 and 143. The redistribution substrate 100 may be formed by substantially the same method as that discussed above with reference to FIGS. 3 to 13. However, the redistribution substrate 100 may be formed in a panel or wafer level.

A semiconductor chip 200 may be provided on the redistribution substrate 100 so as to allow a chip pad 210 of the semiconductor chip 200 to face the redistribution substrate 100. First and second connection terminals 220 and 230 may be formed between the substrate pads 141 and 143 and the chip pads 210. A plurality of semiconductor chips 200 may be mounted. The semiconductor chips 200 may be disposed spaced apart from each other. A molding layer 300 may be provided on a top surface of the redistribution substrate 100, thereby covering the semiconductor chips 200. Afterwards, the carrier substrate 900 may be removed to expose a bottom surface of the first dielectric layer 101 and a bottom surface of the first redistribution pattern 110.

Referring to FIG. 15, a terminal pad 410 and an external coupling terminal 400 may be formed on an exposed bottom surface of the redistribution substrate 100. The terminal pad 410 and the external coupling terminal 400 may be provided in plural.

The molding layer 300 and the redistribution substrate 100 may be sawed along a scribe line SL to separate a plurality of semiconductor packages 10 from each other.

In this description, semiconductor packages may be fabricated in a chip, panel, or wafer level. The following will illustrate and explain a single semiconductor package for brevity of description, but methods of fabricating semiconductor packages are not limited to the chip-level fabrication.

Figure 16:
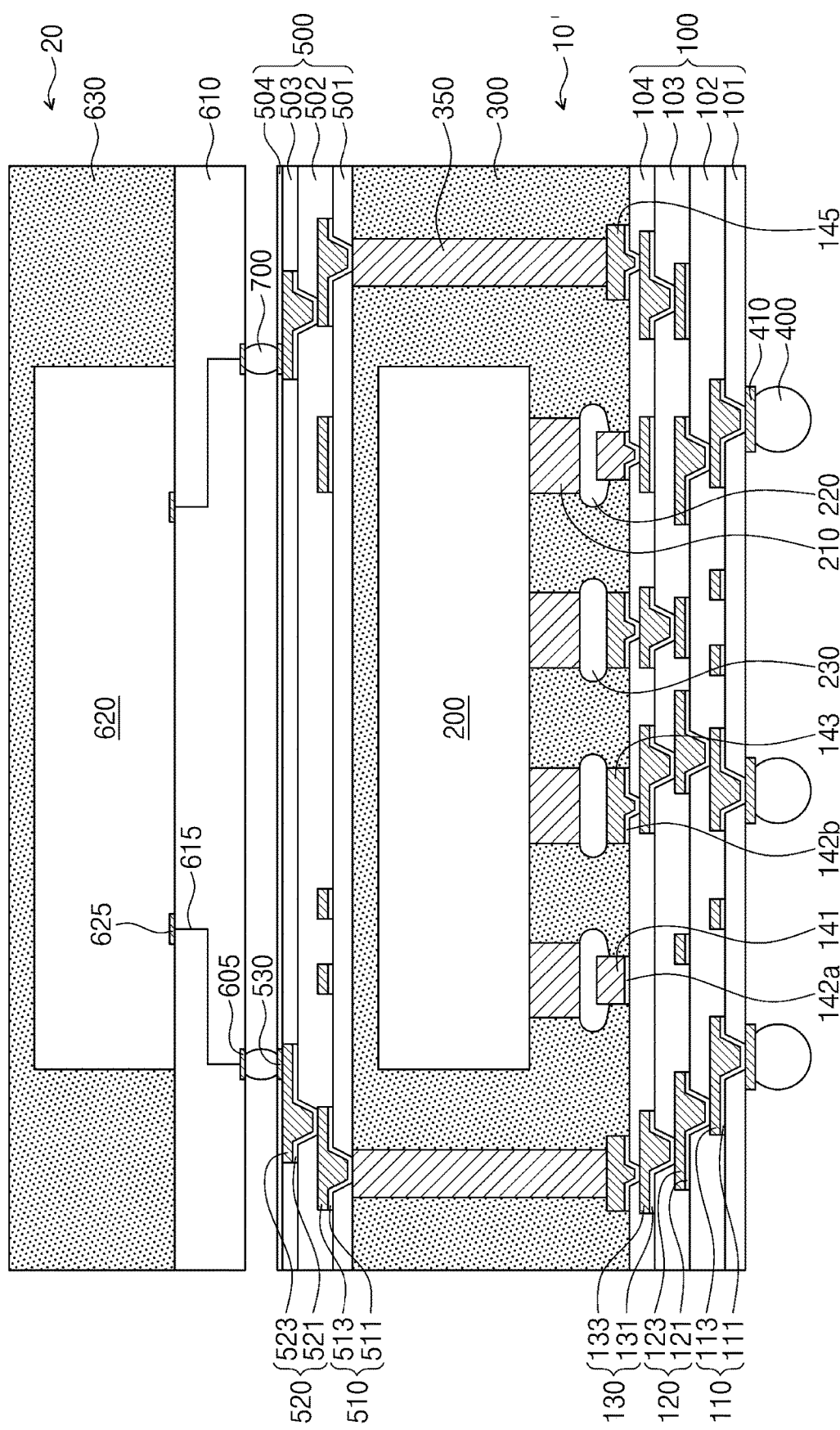
FIG. 16 illustrates a cross-sectional view showing a semiconductor package, according to some example embodiments of the present inventive concepts.

FIG. 16 illustrates a cross-sectional view showing a semiconductor package according to some example embodiments of the present inventive concepts.

Referring to FIG. 16, a semiconductor package may include a lower package 10' and an upper package 20. For example, the semiconductor package may be a package-on-package (POP) in which the upper package 20 is mounted on the lower package 10'.

The lower package 10' may be similar to that discussed with reference to FIGS. 1 and 2. For example, the lower package 10' may include a redistribution substrate 100, a semiconductor chip 200, and a molding layer 300, and may further include a conductive via 350.

The redistribution substrate 100 may include first, second, third, and fourth dielectric layers 101, 102, 103, and 104; first, second, and third redistribution patterns 110, 120, and 130; and first and second substrate pads 141 and 143. The redistribution substrate 100 may be substantially the same as that discussed with reference to FIGS. 1 and 2. In addition, the redistribution substrate 100 may further include a third substrate pad 145. The third substrate pad 145 may be disposed at an outer region of the redistribution substrate 100. For example, the first and second substrate pads 141 and 143 may be disposed below the semiconductor chip 200, and the third substrate pad 145 may be disposed spaced apart from the semiconductor chip 200. The third substrate pad 145 may penetrate the fourth dielectric layer 104 and may be coupled to the third redistribution pattern 130. The third substrate pad 145 may be provided in plural. The third substrate pad 145 may have a pillar shape formed on the top surface of the redistribution substrate 100. For example, the third substrate pad 145 may be a component which is formed together when the first and second substrate pads 141 and 143 are formed. The third substrate pad 145 may have a top surface at a level the same as or similar to that of height the top surface of the first substrate pad 141.

A fifth seed pattern may be provided between the third substrate pad 145 and the fourth dielectric layer 104 and between the third substrate pad 145 and the third redistribution pattern 130. The fifth seed pattern may contact a bottom surface of the third substrate pad 145 and upper surfaces of the fourth dielectric layer 104 and the third redistribution pattern 130. The fifth seed pattern may include a conductive material, such as titanium (Ti) and/or tantalum (Ta).

The semiconductor chip 200 and the molding layer 300 may be substantially the same as those discussed with reference to FIGS. 1 and 2. For example, the semiconductor chip 200 may be coupled through the first and second connection terminals 220 and 230 to the first and second substrate pads 141 and 143.

The conductive via 350 may be provided on the redistribution substrate 100. The conductive via 350 may be disposed laterally spaced apart from the semiconductor chip 200. The conductive via 350 may vertically penetrate the molding layer 300. The conductive via 350 may be coupled to the redistribution substrate 100. For example, the conductive via 350 may be connected to the third substrate pad 145 of the redistribution substrate 100. The conductive via 350 may have a bottom surface in contact with the top surface of the third substrate pad 145. The conductive via 350 may be electrically connected through the third substrate pad 145 and the redistribution patterns 110, 120, and 130 to the external coupling terminal 400 or the semiconductor chip 200. The conductive via 350 may include a metal pillar. The conductive via 350 may be provided in plural.

The molding layer 300 may be formed on the redistribution substrate 100, thereby covering the semiconductor chip 200. The molding layer 300 may cover a sidewall of the conductive via 350, but may not cover a top surface of the conductive via 350.

The lower package 10' may further include an upper redistribution layer 500. The upper redistribution layer 500 may be disposed on a top surface of the molding layer 300 and the top surface of the conductive via 350. The upper redistribution layer 500 may include an upper dielectric pattern, a first upper redistribution pattern 510, a second upper redistribution pattern 520, and an upper pad 530. The upper dielectric pattern may include a first upper dielectric layer 501, a second upper dielectric layer 502, and a third upper dielectric layer 503 that are sequentially stacked. The first upper dielectric layer 501 may cover the molding layer 300. The first, second, and third upper dielectric layers 501, 502, and 503 may include a photosensitive polymer.

The first upper redistribution pattern 510 may be provided on the first upper dielectric layer 501. The first upper redistribution pattern 510 may include a first upper conductive pattern 513 and a first upper seed pattern 511. The first upper redistribution pattern 510 may penetrate the first upper dielectric layer 501 and may be coupled to the conductive via 350. The first upper redistribution pattern 510 may be covered with the second upper dielectric layer 502.

The second upper redistribution pattern 520 may be provided on the second upper dielectric layer 502. The second upper redistribution pattern 520 may include a second upper conductive pattern 523 and a second upper seed pattern 521. The second upper redistribution pattern 520 may penetrate the second upper dielectric layer 502 and may be coupled to the first upper redistribution pattern 510. The second upper redistribution pattern 520 may be covered with the third upper dielectric layer 503.

The upper pad 530 may be provided on the second upper redistribution pattern 520 and may be coupled to the second upper redistribution pattern 520. The upper pad 530 may include a conductive material, such as metal.

The upper redistribution layer 500 may further include an upper passivation layer 504. The upper passivation layer 504 may cover a top surface of the third upper dielectric layer 503 and a top surface of the second upper redistribution pattern 520. The upper passivation layer 504 may include, for example, a dielectric polymer. Differently from that shown, the lower package 10' may not include the upper redistribution layer 500.

The upper package 20 may be mounted on the lower package 10'. The upper package 20 may include an upper package substrate 610, an upper semiconductor chip 620, and an upper molding layer 630. The upper package substrate 610 may be a printed circuit board (PCB). Alternatively, the upper package substrate 610 may be a redistribution layer. For example, the upper package 20 may be the semiconductor package 10 discussed above in FIGS. 1 and 2. A metal pad 605 may be disposed on a bottom surface of the upper package substrate 610.

The upper semiconductor chip 620 may be disposed on the upper package substrate 610. The upper semiconductor chip 620 may include integrated circuits, and the integrated circuits may include a memory circuit, a logic circuit, or a combination thereof. The upper semiconductor chip 620 may be of a different semiconductor chip from the semiconductor chip 200. An upper chip pad 625 of the upper semiconductor chip 620 may be electrically connected to the metal pad 605 through an internal line 615 in the upper package substrate 610. The internal line 615 is schematically illustrated in FIG. 16, and a shape and arrangement of the internal line 615 may be variously changed.

The upper molding layer 630 may be provided on the upper package substrate 610, thereby covering the upper semiconductor chip 620. The upper molding layer 630 may include a dielectric polymer, such as an epoxy-based polymer.

Conductive terminals 700 may be disposed between the lower package 10' and the upper package 20. The conductive terminals 700 may be interposed between and electrically connect the upper pads 530 and the metal pads 605. Therefore, the upper package 20 may be electrically connected to the semiconductor chip 200 and the external coupling terminal 400 through the conductive terminal 700, the upper redistribution layer 500, and the conductive via 350.

An electrical connection of the upper package 20 may include an electrical connection with integrated circuits in the upper semiconductor chip 620. The presence of the upper redistribution layer 500 may freely design the internal line 615 in the upper package substrate 610 and integrated circuits in the upper semiconductor chip 620.

According to some example embodiments, the lower package 10' may not include the upper redistribution layer 500. In this case, the conductive terminal 700 may be disposed on the conductive via 350, and may be coupled to the conductive via 350 and the metal pad 605.

Figure 17:
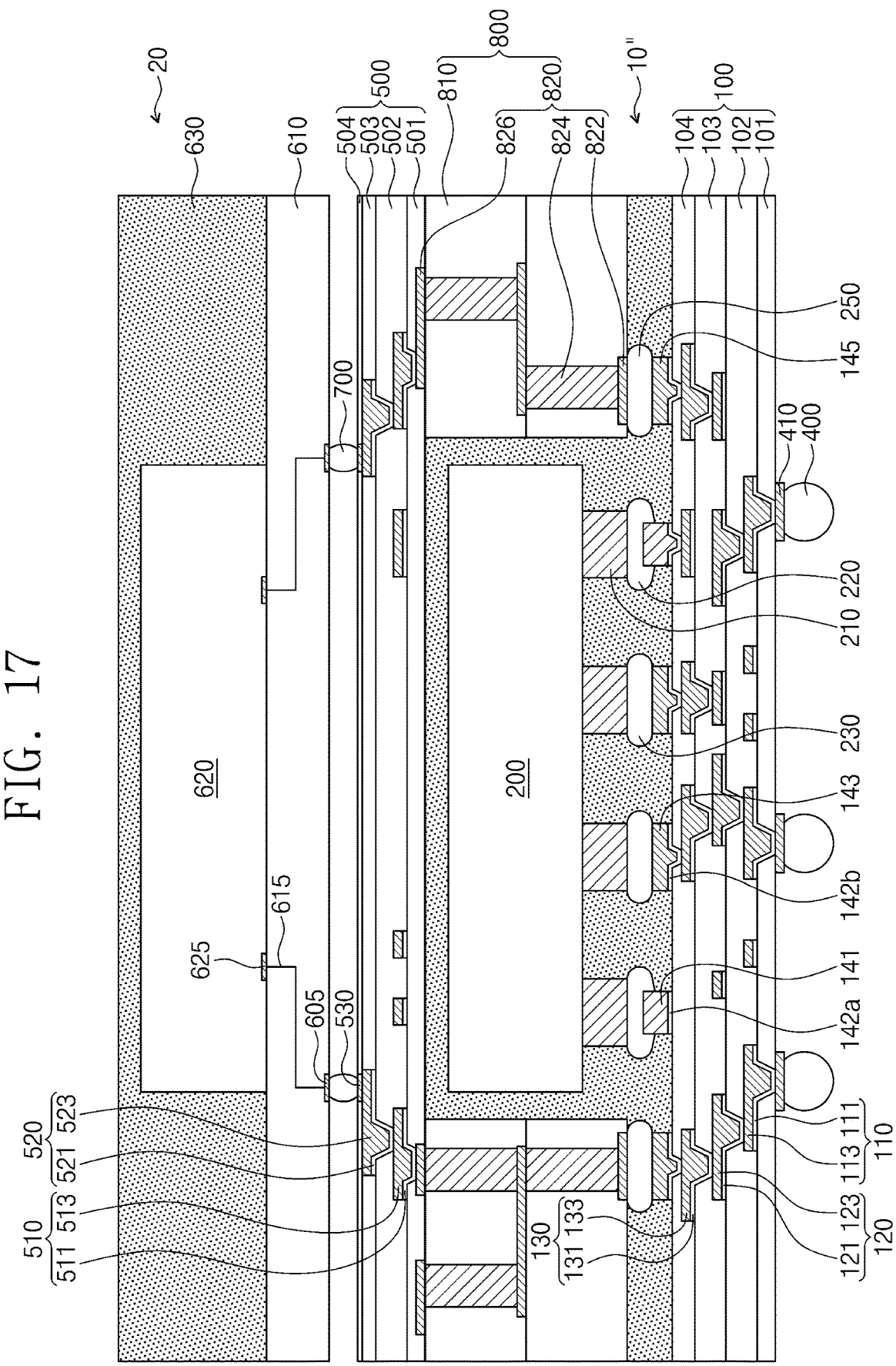
FIG. 17 illustrates a cross-sectional view showing a semiconductor package according to some example embodiments of the present inventive concepts.

FIG. 17 illustrates a cross-sectional view showing a semiconductor package according to some example embodiments of the present inventive concepts.

Referring to FIG. 17, a semiconductor package may include a lower package 10" and an upper package 20. For example, the semiconductor package may be a package-on-package (POP) in which the upper package 20 is mounted on the lower package 10".

The lower package 10" may be similar to that discussed with reference to FIGS. 1 and 2. For example, the lower package 10" may include a redistribution substrate 100, a semiconductor chip 200, and a molding layer 300, and may further include a connection substrate 800.

The redistribution substrate 100 may include first, second, third, and fourth dielectric layers 101, 102, 103, and 104; first, second, and third redistribution patterns 110, 120, and 130; and first, second, and third substrate pads 141, 143, and 145. The redistribution substrate 100 may be substantially the same as that discussed with reference to FIG. 16.

The connection substrate 800 may be disposed on the redistribution substrate 100. The connection substrate 800 may have an opening that penetrates therethrough. For example, the opening may have an open hole that connects top and bottom surfaces of the connection substrate 800. The bottom surface of the connection substrate 800 may be spaced apart from the top surface of the connection substrate 800. The connection substrate 800 may include a base layer 810 and a conductive part 820 that is a line pattern provided in the base layer 810. For example, the base layer 810 may include silicon oxide. The conductive part 820 may be disposed in the opening at an outer region of the connection substrate 800. The conductive part 820 may include lower pads 822, vias 824, and upper pads 826. The lower pads 822 may be disposed on a lower portion of the connection substrate 800. The vias 824 may penetrate the base layer 810, and may be electrically connected to the lower pads 822 and the upper pads 826.

The connection substrate 800 may be mounted on the redistribution substrate 100. For example, the connection substrate 800 may be electrically connected to the third substrate pad 145 of the redistribution substrate 100 through third connection terminals 250 provided on the lower pads 822. The third substrate pad 145 may be coupled to the third redistribution pattern 130. Therefore, the connection substrate 800 may be electrically connected to the semiconductor chip 200 and the external coupling terminal 400.

The semiconductor chip 200 may be disposed on the redistribution substrate 100. The semiconductor chip 200 may be disposed in the opening of the connection substrate 800. The semiconductor chip 200 may be the same as or similar to that discussed with reference to FIGS. 1 and 2. For example, the semiconductor chip 200 may be coupled through the first and second connection terminals 220 and 230 to the first and second substrate pads 141 and 143.

The molding layer 300 may fill a space between the semiconductor chip 200 and the connection substrate 800, between the semiconductor chip 200 and the redistribution substrate 100, and between the connection substrate 800 and the redistribution substrate 100.

The lower package 10″ may further include an upper redistribution layer 500. The upper redistribution layer 500 may be disposed on a top surface of the molding layer 300 and a top surface of the connection substrate 800. The upper redistribution layer 500 may include an upper dielectric pattern, a first upper redistribution pattern 510, a second upper redistribution pattern 520, and an upper pad 530. The upper dielectric pattern may include a first upper dielectric layer 501, a second upper dielectric layer 502, and a third upper dielectric layer 503 that are sequentially stacked. The first upper dielectric layer 501 may cover the molding layer 300. The first upper redistribution pattern 510 may penetrate the first upper dielectric layer 501 and may be coupled to the upper pads 826 of the connection substrate 800.

The upper package 20 may be mounted on the lower package 10″. The upper package 20 may include an upper package substrate 610, an upper semiconductor chip 620, and an upper molding layer 630. The upper package 20 may be the same as or similar to that discussed with reference to FIG. 16. For example, the upper semiconductor chip 620 may be mounted on the upper package substrate 610, which upper package substrate 610 may be provided thereon with the upper molding layer 630 that covers the upper semiconductor chip 620.

A conductive terminal 700 may be interposed between and electrically connect the upper pad 530 and the metal pad 605. Therefore, the upper package 20 may be electrically connected to the semiconductor chip 200 and the external coupling terminal 400 through the conductive terminal 700, the upper redistribution layer 500, and the connection substrate 800. Each of the conductive terminal 700, the upper chip pad 625, and the metal pad 605 may be provided in plural.

In methods of fabricating semiconductor packages according to some example embodiments of the present inventive concepts, a single process may form substrate pads whose heights are different from each other, and it may not be required that a separate process be performed to change a height of any one substrate pad or to form a substrate pad having a different height. As a result, it may be possible to simplify the methods of fabricating the semiconductor packages.

Furthermore, when a semiconductor chip is mounted, even when an excessive pressure is applied to the semiconductor chip, a certain gap may be formed between chip pads and substrate pads, and a connection member may have a small amount of protrusion that projects onto a lateral surface of the substrate pads. Therefore, no bridge phenomenon may occur between neighboring substrate pads.

Moreover, because not only a second substrate pad but also a first substrate pad is used to mount the semiconductor chip on a redistribution substrate, the semiconductor chip may be rigidly mounted on the redistribution substrate and the semiconductor package may be fabricated to have increased structural stability.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a redistribution substrate that includes a dielectric pattern and a redistribution pattern in the dielectric pattern;
a first substrate pad on a top surface of the redistribution substrate, the first substrate pad penetrating the dielectric pattern and being coupled to the redistribution pattern;
a second substrate pad on the top surface of the redistribution substrate and spaced apart from the first substrate pad;
a semiconductor chip on the redistribution substrate;
a first connection terminal that connects the first substrate pad to a first chip pad of chip pads of the semiconductor chip; and
a second connection terminal that connects the second substrate pad to a second chip pad of the chip pads of the semiconductor chip,
wherein a top surface of the second substrate pad is located at a level higher than a level of a top surface of the first substrate pad,
wherein a maximum width of the second substrate pad is less than a maximum width of the first substrate pad,
wherein the maximum width of the first substrate pad is substantially the same as maximum widths of the first and second chip pads, and
wherein the maximum width of the second substrate pad is less than the maximum widths of the first and second chip pads.

2. The semiconductor package of claim 1, wherein a volume of the first substrate pad is substantially same as a volume of the second substrate pad.

3. The semiconductor package of claim 1,
wherein the first connection terminal protrudes onto a lateral surface of the first chip pad of the chip pads, and
wherein the second connection terminal protrudes onto a lateral surface of the second chip pad of the chip pads.

4. The semiconductor package of claim 3, wherein the second connection terminal extends onto the lateral surface of the second chip pad of the chip pads from a gap between the second substrate pad and the second chip pad of the chip pads so as to cover a lateral surface of the second substrate pad.

5. The semiconductor package of claim 1, wherein a volume of the first connection terminal is substantially same as a volume of the second connection terminal.

6. The semiconductor package of claim 1, wherein a second height of the second substrate pad is about 1.5 times to about 3 times a first height of the first substrate pad.

7. The semiconductor package of claim 6,
wherein the first height of the first substrate pad is in a range of about 1 μm to about 5 μm, and
wherein the second height of the second substrate pad is in a range of about 5 μm to about 10 μm.

8. The semiconductor package of claim 1,
wherein the second substrate pad is provided on a top surface of the dielectric pattern of the redistribution substrate, and wherein the second substrate pad and the redistribution pattern are insulated from each other by the dielectric pattern between the second substrate pad and the redistribution pattern.

9. The semiconductor package of claim 1, wherein the second substrate pad penetrates the dielectric pattern of the redistribution substrate and is coupled to the redistribution pattern of the redistribution substrate.

10. The semiconductor package of claim 1, further comprising:
a molding layer on the redistribution substrate, the molding layer covering the semiconductor chip;
a through electrode that penetrates the molding layer on one side of the semiconductor chip, the through electrode being coupled to the redistribution pattern of the redistribution substrate; and
an upper redistribution substrate on the dielectric pattern and the semiconductor chip, the upper redistribution substrate being electrically connected to the through electrode.

11. The semiconductor package of claim 1, further comprising:
a connection substrate on the redistribution substrate, the connection substrate having an opening that penetrates the connection substrate, and the semiconductor chip being disposed in the opening of the connection substrate;
a molding layer that fills a gap between the connection substrate and the semiconductor chip in the opening; and
an upper redistribution substrate on the connection substrate and the semiconductor chip, the upper redistribution substrate being electrically connected to a line pattern in the connection substrate.

12. A semiconductor package, comprising:
a redistribution substrate that includes a plurality of first substrate pads and a plurality of second substrate pads on a top surface of the redistribution substrate, the first substrate pads extending into the redistribution substrate and being connected to a redistribution pattern of the redistribution substrate;
a semiconductor chip mounted on the redistribution substrate, the semiconductor chip including a plurality of first chip pads and a plurality of second chip pads;
a plurality of first connection terminals that connect the first chip pads to the first substrate pads;
a plurality of second connection terminals that connect the second chip pads to the second substrate pads;
a molding layer on the redistribution substrate and in which the semiconductor chip is embedded; and
a plurality of external terminals on a bottom surface of the redistribution substrate,
wherein a volume of each of the first substrate pads is substantially same as a volume of each of the second substrate pads,
wherein a height of the first substrate pad is less than a height of the second substrate pad, and
wherein an interval between the first chip pads and the first substrate pads is greater than an interval between the second chip pads and the second substrate pads.

13. The semiconductor package of claim 12,
wherein a volume of each of the first connection terminals is substantially the same as a volume of each of the second connection terminals, and
wherein a portion of the second connection terminals extends onto and covers a lateral surface of the second substrate pads.

14. The semiconductor package of claim 12,
wherein the first substrate pads are provided on a central region of the redistribution substrate,
wherein the second substrate pads are provided on an outer region of the redistribution substrate, and
wherein a first interval between neighboring first substrate pads is less than a second interval between neighboring second substrate pads.

15. A semiconductor package, comprising:
a redistribution substrate that includes a dielectric pattern and a redistribution pattern in the dielectric pattern;
a first substrate pad on a top surface of the redistribution substrate, the first substrate pad penetrating the dielectric pattern and being coupled to the redistribution pattern;
a second substrate pad on the top surface of the redistribution substrate and spaced apart from the first substrate pad;
a semiconductor chip on the redistribution substrate;
a first connection terminal that connects the first substrate pad to a first chip pad of chip pads of the semiconductor chip; and
a second connection terminal that connects the second substrate pad to a second chip pad of the chip pads of the semiconductor chip,
wherein a top surface of the second substrate pad is located at a level higher than a level of a top surface of the first substrate pad,
wherein a maximum width of the second substrate pad is less than a maximum width of the first substrate pad, and
wherein a maximum width of the first chip pad is substantially the same as a maximum width of the second chip pad.

16. The semiconductor package of claim 15,
wherein the maximum width of the first substrate pad is substantially the same as maximum widths of the chip pads, and
wherein the maximum width of the second substrate pad is less than the maximum widths of the chip pads.

17. The semiconductor package of claim 15, wherein a volume of the first substrate pad is substantially the same as a volume of the second substrate pad.

18. The semiconductor package of claim 15,
wherein the first connection terminal protrudes onto a lateral surface of the first chip pad of the chip pads,
wherein the second connection terminal protrudes onto a lateral surface of the second chip pad of the chip pads, and
wherein the second connection terminal extends onto the lateral surface of the second chip pad of the chip pads from a gap between the second substrate pad and the second chip pad of the chip pads so as to cover a lateral surface of the second substrate pad.

19. The semiconductor package of claim 15,
wherein a first height of the first substrate pad is in a range of about 1 μm to about 5 μm, and
wherein a second height of the second substrate pad is in a range of about 5 μm to about 10 μm.

20. The semiconductor package of claim 15,
wherein the second substrate pad is provided on a top surface of the dielectric pattern of the redistribution substrate, and
wherein the second substrate pad and the redistribution pattern are insulated from each other by the dielectric pattern between the second substrate pad and the redistribution pattern.

* * * * *